United States Patent
Morikazu (10) Patent No.: US 8,258,428 B2
(45) Date of Patent: Sep. 4, 2012

(54) LASER BEAM PROCESSING MACHINE

(75) Inventor: Hiroshi Morikazu, Tokyo (JP)

(73) Assignee: Disco Corporation, Tokyo (JP)

( * ) Notice: Subject to any disclaimer, the term of this patent is extended or adjusted under 35 U.S.C. 154(b) by 1434 days.

(21) Appl. No.: 11/822,657

(22) Filed: Jul. 9, 2007

(65) Prior Publication Data

US 2008/0011723 A1    Jan. 17, 2008

(30) Foreign Application Priority Data

Jul. 11, 2006   (JP) .................................. 2006-190539

(51) Int. Cl.
*B23K 26/38* (2006.01)
*B23K 26/067* (2006.01)

(52) U.S. Cl. ................................ 219/121.7; 219/121.77

(58) Field of Classification Search ............. 219/121.62, 219/121.7, 121.71, 121.73; 359/285
See application file for complete search history.

(56) References Cited

U.S. PATENT DOCUMENTS

| | | | | |
|---|---|---|---|---|
| 5,067,798 | A * | 11/1991 | Tomoyasu | 359/286 |
| 5,841,099 | A * | 11/1998 | Owen et al. | 219/121.71 |
| 5,965,043 | A * | 10/1999 | Noddin et al. | 219/121.71 |
| 6,285,002 | B1 * | 9/2001 | Ngoi et al. | 219/121.73 |
| 2002/0031650 | A1 * | 3/2002 | Fischer et al. | 428/209 |
| 2002/0092833 | A1 * | 7/2002 | Lipman et al. | 219/121.7 |
| 2002/0104831 | A1 * | 8/2002 | Chang et al. | 219/121.7 |
| 2002/0141035 | A1 * | 10/2002 | Davidson et al. | 359/285 |
| 2003/0047544 | A1 * | 3/2003 | De Steur et al. | 219/121.71 |
| 2003/0156323 | A1 * | 8/2003 | Overbeck | 359/385 |
| 2003/0213787 | A1 * | 11/2003 | Dunsky et al. | 219/121.7 |
| 2004/0129685 | A1 * | 7/2004 | Arai et al. | 219/121.7 |
| 2005/0082267 | A1 * | 4/2005 | Nagai et al. | 219/121.82 |
| 2005/0224475 | A1 | 10/2005 | Nomaru | |
| 2006/0028710 | A1 * | 2/2006 | Johnson et al. | 359/311 |
| 2007/0045254 | A1 | 3/2007 | Morikazu | |
| 2007/0075059 | A1 * | 4/2007 | Arai | 219/121.71 |
| 2007/0138156 | A1 * | 6/2007 | Nomaru et al. | 219/121.73 |

FOREIGN PATENT DOCUMENTS

| | | |
|---|---|---|
| JP | 2002-263873 | 9/2002 |
| JP | 2003-136270 | 5/2003 |
| JP | 2003-163323 | 6/2003 |
| JP | 2005-297012 | 10/2005 |
| JP | 2007-67082 | 3/2007 |

* cited by examiner

*Primary Examiner* — Geoffrey S Evans
(74) *Attorney, Agent, or Firm* — Smith, Gambrell & Russell, LLP (57) ABSTRACT

A laser beam processing machine comprising a chuck table for holding a workpiece, a laser beam application means for applying a laser beam to the workpiece held on the chuck table, a processing feed means for moving the chuck table and the laser beam application means relative to each other in a processing-feed direction and an indexing-feed means for moving the chuck table and the laser beam application means in an indexing-feed direction perpendicular to the processing-feed direction, wherein the laser beam application means comprises a first laser beam application means for applying a first pulse laser beam having an energy density per one pulse of 20 to 60 J/cm$^2$ and a second laser beam application means for applying a second pulse laser beam having an energy density per one pulse of 3 to 20 J/cm$^2$.

3 Claims, 5 Drawing Sheets

LASER BEAM PROCESSING MACHINE

FIELD OF THE INVENTION

The present invention relates to a laser beam processing machine for forming via holes reaching electrodes from the rear surface of a substrate in a wafer that has a plurality of devices on the front surface of the substrate and has the electrodes on each of the devices.

DESCRIPTION OF THE PRIOR ART

In the production process of a semiconductor device, a plurality of areas are sectioned by dividing lines called "streets" arranged in a lattice pattern on the front surface of a substantially disk-like semiconductor wafer, and a device such as IC or LSI is formed in each of the sectioned areas. Individual semiconductor chips are manufactured by cutting this semiconductor wafer along the streets to divide it into the areas having each a device formed therein.

To reduce the size and increase the number of functions of an apparatus, a modular structure for connecting the electrodes of a plurality of semiconductor chips laminated is disclosed by JP-A 2003-163323. This modular structure is such that electrodes are formed on the front surface of a semiconductor wafer, via holes reaching the electrodes are formed from the rear side of the wafer at positions where the electrodes are formed, and a conductive material such as aluminum for connecting the electrodes is embedded in the via holes.

The via holes formed in the above semiconductor wafer are generally formed by a drill. Therefore, the diameters of the via holes formed in the semiconductor wafer are as small as 100 to 300 µm, and drilling the via holes is not always satisfactory in terms of productivity. In addition, as the thickness of each of the above electrodes is about 1 to 5 µm, the drill must be controlled extremely accurately in order to form the via holes only in the substrate such as a silicon substrate forming the wafer without damaging the electrodes.

To solve the above problem, the applicant of the present application proposes as JP-A 2007-67082 a method of efficiently forming a via hole reaching a bonding pad in a wafer having a plurality of devices on the front surface of a substrate and bonding pads on each of the devices by applying a pulse laser beam from the rear surface of the substrate.

Although a conductive material such as aluminum or copper is embedded in the via holes formed in the substrate as described above, when aluminum or copper is directly embedded in the via holes, aluminum or copper atoms are diffused into the inside of the substrate made of silicon to reduce the quality of each device. Therefore, after an insulating film is formed on the inner peripheral surfaces of the via holes, a conductive material such as aluminum or copper is embedded.

Therefore, when the via holes are formed by applying a pulse laser beam as described above, the laser beam used to form the via holes in the substrate made of silicon is slightly applied to the rear surfaces of the bonding pads, whereby metal atoms forming the bonding pads are scattered to become metal contaminants which adhere to the inner peripheral walls of the via holes. When aluminum or copper atoms adhere to the inner walls of the via holes, a problem arises that the atoms diffuse into the inside of the substrate made of silicon to reduce the quality of each device.

SUMMARY OF THE INVENTION

It is an object of the present invention to provide a laser beam processing machine capable of removing metal contaminants efficiently even when the metal contaminants scattered by the application of a pulse laser beam to the bonding pads adhere to the inner peripheral walls of via holes when the via holes are formed.

To attain the above object, according to the present invention, there is provided a laser beam processing machine comprising a chuck table for holding a workpiece, a laser beam application means for applying a laser beam to the workpiece held on the chuck table, a processing-feed means for moving the chuck table and the laser beam application means relative to each other in a processing-feed direction and an indexing-feed means for moving the chuck table and the laser beam application means in an indexing-feed direction perpendicular to the processing-feed direction, wherein the laser beam application means comprises a first laser beam application means for applying a first pulse laser beam having an energy density per one pulse of 20 to 60 $J/cm^2$ and a second laser beam application means for applying a second pulse laser beam having an energy density per one pulse of 3 to 20 $J/cm^2$.

The above laser beam application means comprises a pulse laser beam oscillation means for oscillating a pulse laser beam and a beam splitter for dividing a pulse laser beam oscillated from the pulse laser beam oscillation means into a first pulse laser beam and a second pulse laser beam.

The above second laser beam application means comprises a first acousto-optic deflection means for deflecting the optical axis of the second pulse laser beam divided by the beam splitter into the processing-feed direction and a second acousto-optic deflection means for deflecting the optical axis of the second pulse laser beam in the indexing-feed direction.

The above first laser beam application means sets the spot diameter of the first pulse laser beam to 0.75 to 0.9 D and the above second laser beam application means sets the spot diameter of the second pulse laser beam to 0.2 to 0.3 D when the diameter of the via hole to be formed is represented by D.

In the laser beam processing machine of the present invention, via holes reaching the bonding pads are formed in the substrate with the first pulse laser beam having a relatively high energy density (20 to 60 $J/cm^2$) applied by the first laser beam application means. Even when metal contaminants scattered by the application of the first pulse laser beam to the bonding pads at the time of forming the via holes adhere to the inner peripheral walls of the via holes, the metal contaminants adhering to the inner peripheral walls of the via holes can be removed efficiently with the second pulse laser beam having a relatively low energy density (3 to 20 $J/cm^2$) applied by the second laser beam application means. Since the energy density of the second pulse laser beam applied by the second laser beam application means is relatively low, the substrate is not processed.

DETAILED DESCRIPTION OF THE PREFERRED EMBODIMENT

A preferred embodiment of the present invention will be described in more detail with reference to the accompanying drawings.

Figure 1:
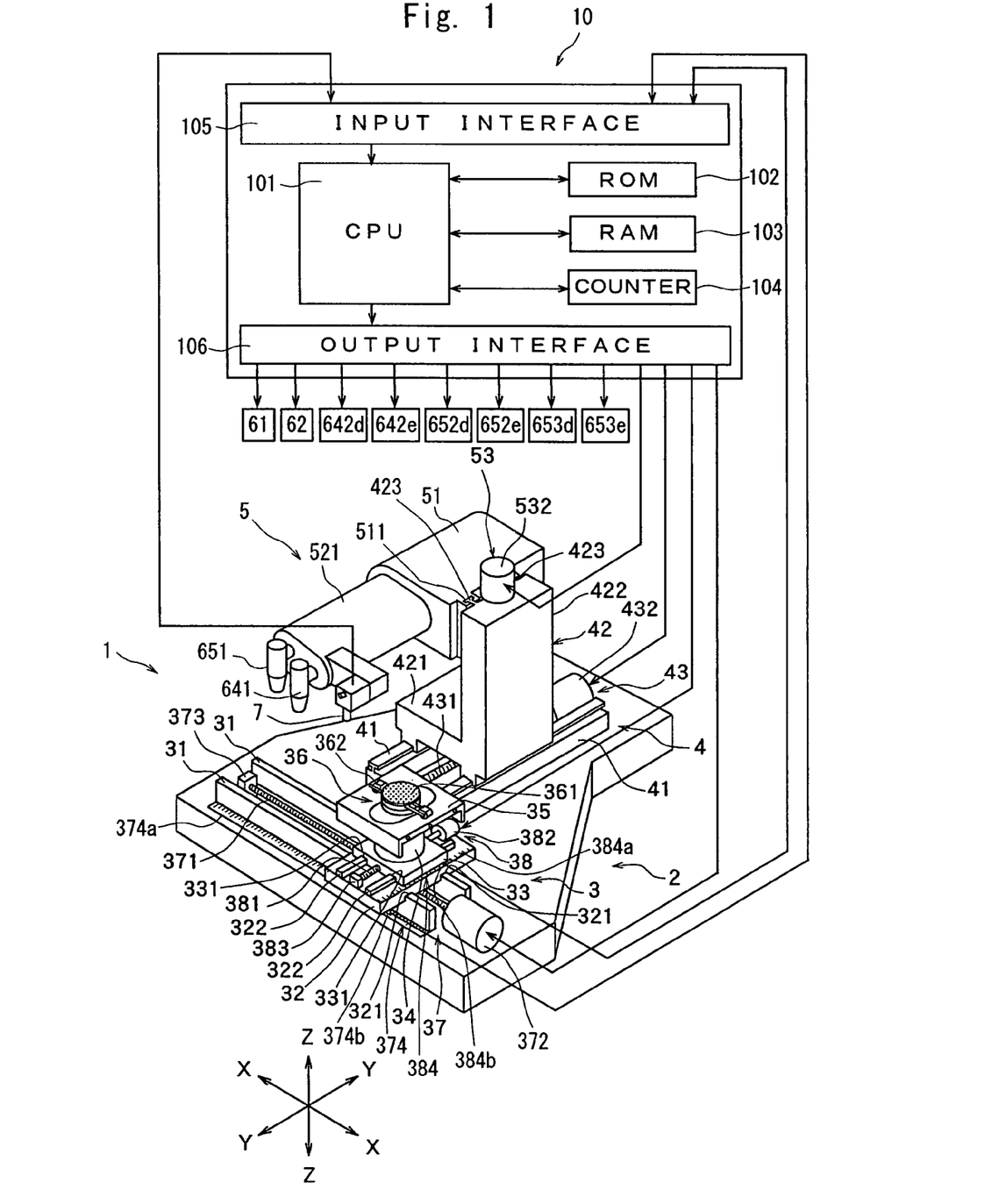
FIG. 1 is a perspective view of a laser beam processing machine constituted according to the present invention.

FIG. 1 is a perspective view of a laser beam processing machine constituted according to the present invention. The laser beam processing machine 1 shown in FIG. 1 comprises a stationary base 2, a chuck table mechanism 3 for holding a workpiece, which is mounted on the stationary base 2 in such a manner that it can move in a processing-feed direction indicated by an arrow X, a laser beam application unit support mechanism 4 mounted on the stationary base 2 in such a manner that it can move in an indexing-feed direction indicated by an arrow Y perpendicular to the direction indicated by the arrow X, and a laser beam application unit 5 mounted on the laser beam application unit support mechanism 4 in such a manner that it can move in a direction indicated by an arrow Z.

The above chuck table mechanism 3 comprises a pair of guide rails 31 and 31 which are mounted on the stationary base 2 and arranged parallel to each other in the processing-feed direction indicated by the arrow X, a first sliding block 32 mounted on the guide rails 31 and 31 in such a manner that it can move in the processing-feed direction indicated by the arrow X, a second sliding block 33 mounted on the first sliding block 32 in such a manner that it can move in the indexing-feed direction indicated by the arrow Y, a support table 35 supported on the second sliding block 33 by a cylindrical member 34, and a chuck table 36 as a workpiece holding means. This chuck table 36 comprises an adsorption chuck 361 made of a porous material, and a workpiece, for example, a disk-like semiconductor wafer is held on a holding surface which is the top surface of the adsorption chuck 361 by a suction means that is not shown. The chuck table 36 constituted as described above is rotated by a pulse motor (not shown) installed in the cylindrical member 34. The chuck table 36 is provided with clamps 362 for fixing an annular frame which will be described later.

The above first sliding block 32 has, on its undersurface, a pair of to-be-guided grooves 321 and 321 to be fitted to the above pair of guide rails 31 and 31 and, on the top surface, a pair of guide rails 322 and 322 formed parallel to each other in the indexing-feed direction indicated by the arrow Y. The first sliding block 32 constituted as described above can move along the pair of guide rails 31 and 31 in the processing-feed direction indicated by the arrow X by fitting the to-be-guided grooves 321 and 321 to the pair of guide rails 31 and 31, respectively. The chuck table mechanism 3 in the illustrated embodiment comprises a processing-feed means 37 for moving the first sliding block 32 along the pair of guide rails 31 and 31 in the processing-feed direction indicated by the arrow X. The processing-feed means 37 comprises a male screw rod 371 that is arranged between the above pair of guide rails 31 and 31 in parallel thereto and a drive source such as a pulse motor 372 for rotary driving the male screw rod 371. The male screw rod 371 is, at its one end, rotatably supported to a bearing block 373 fixed on the above stationary base 2 and is, at the other end, transmission-coupled to the output shaft of the above pulse motor 372. The male screw rod 371 is screwed into a threaded through-hole formed in a female screw block (not shown) projecting from the undersurface of the center portion of the first sliding block 32. Therefore, by driving the male screw rod 371 in a normal direction or reverse direction with the pulse motor 372, the first sliding block 32 is moved along the guide rails 31 and 31 in the processing-feed direction indicated by the arrow X.

The laser beam processing machine 1 in the illustrated embodiment comprises a processing-processing-feed amount detection means 374 for detecting the processing-feed amount of the above chuck table 36. The processing-feed amount detection means 374 comprises a linear scale 374a arranged along the guide rail 31 and a read head 374b which is mounted on the first sliding block 32 and moves along the linear scale 374a together with the first sliding block 32. The read head 374b of this processing-feed amount detection means 374 supplies one pulse signal for every 1 μm to a control means which will be described later in the illustrated embodiment. The control means later described counts the input pulse signals to detect the processing-feed amount of the chuck table 36. When the pulse motor 372 is used as a drive source for the above processing-feed means 37, the processing-feed amount of the chuck table 36 can be detected by counting the drive pulses of the control means later described for outputting a drive signal to the pulse motor 372. When a servo motor is used as a drive source for the above processing-feed means 37, the processing-feed amount of the chuck table 36 can be detected by counting pulse signals input into the control means later described from a rotary encoder for detecting the revolution of the servo motor.

The above second sliding block 33 has, on its undersurface, a pair of to-be-guided grooves 331 and 331 to be fitted to the pair of guide rails 322 and 322 on the top surface of the above first sliding block 32 and can move in the indexing-feed direction indicated by the arrow Y by fitting the guide grooves 331 and 331 to the pair of guide rails 322 and 322, respectively. The chuck table mechanism 3 in the illustrated embodiment comprises first indexing means 38 for moving the second sliding block 33 along the pair of to-be-guided rails 322 and 322 on the first sliding block 32 in the indexing-feed direction indicated by the arrow Y. The first indexing means 38 comprises a male screw rod 381 which is arranged between the above pair of guide rails 322 and 322 in parallel thereto and a drive source such as a pulse motor 382 for rotary-driving the male screw rod 381. The male screw rod 381 is, at its one end, rotatably supported to a bearing block 383 fixed on the top surface of the above first sliding block 32 and is, at the other end, transmission-coupled to the output shaft of the above pulse motor 382. The male screw rod 381 is screwed into a threaded through-hole formed in a female screw block (not shown) projecting from the undersurface of the center portion of the second sliding block 33. Therefore, by driving the male screw rod 381 in a normal direction or reverse direction with the pulse motor 382, the second sliding block 33 is moved along the guide rails 322 and 322 in the indexing-feed direction indicated by the arrow Y.

The laser beam processing machine 1 in the illustrated embodiment comprises an indexing-feed amount detection means 384 for detecting the indexing-feed amount of the above second sliding block 33. This index amount detection means 384 comprises a linear scale 384a arranged along the guide rail 322 and a read head 384b which is mounted on the second sliding block 33 and moves along the linear scale 384a together with the second sliding block 33. The read head 384b of the indexing-feed amount detection means 384 supplies one pulse signal for every 1 μm to the control means later described in the illustrated embodiment. The control means later described counts the input pulse signals to detect the indexing-feed amount of the chuck table 36. When the pulse motor 382 is used as a drive source for the above first indexing-feed means 38, the indexing-feed amount of the chuck table 36 can be detected by counting the drive pulses of the control means later described for outputting a drive signal to the pulse motor 382. When a servo motor is used as a drive source for the above first indexing-feed means 38, the indexing-feed amount of the chuck table 36 can be detected by counting pulse signals input into the control means later described from a rotary encoder for detecting the revolution of the servo motor.

The above laser beam application unit support mechanism 4 comprises a pair of guide rails 41 and 41 mounted on the stationary base 2 and arranged parallel to each other in the indexing-feed direction indicated by the arrow Y and a movable support base 42 mounted on the guide rails 41 and 41 in such a manner that it can move in the direction indicated by the arrow Y. This movable support base 42 consists of a movable support portion 421 movably mounted on the guide rails 41 and 41 and a mounting portion 422 mounted on the movable support portion 421. The mounting portion 422 is provided with a pair of guide rails 423 and 423 extending parallel to each other in the direction indicated by the arrow Z on one of its flanks. The laser beam application unit support mechanism 4 in the illustrated embodiment comprises a second indexing-feed means 43 for moving the movable support base 42 along the pair of guide rails 41 and 41 in the indexing-feed direction indicated by the arrow Y. This second indexing-feed means 43 comprises a male screw rod 431 that is arranged between the above pair of guide rails 41 and 41 in parallel thereto and a drive source such as a pulse motor 432 for rotary-driving the male screw rod 431. The male screw rod 431 is, at its one end, rotatably supported to a bearing block (not shown) fixed on the above stationary base 2 and is, at the other end, transmission-coupled to the output shaft of the above pulse motor 432. The male screw rod 431 is screwed into a threaded through-hole formed in a female screw block (not shown) projecting from the undersurface of the center portion of the movable support portion 421 constituting the movable support base 42. Therefore, by driving the male screw rod 431 in a normal direction or reverse direction with the pulse motor 432, the movable support base 42 is moved along the guide rails 41 and 41 in the indexing-feed direction indicated by the arrow Y.

The laser beam application unit 5 in the illustrated embodiment comprises a unit holder 51 and a laser beam application means 52 secured to the unit holder 51. The unit holder 51 has a pair of to-be-guided grooves 511 and 511 to be slidably fitted to the pair of guide rails 423 and 423 on the above mounting portion 422 and is supported in such a manner that it can move in the direction indicated by the arrow Z by fitting the to-be-guided grooves 511 and 511 to the above guide rails 423 and 423, respectively.

Figure 2:
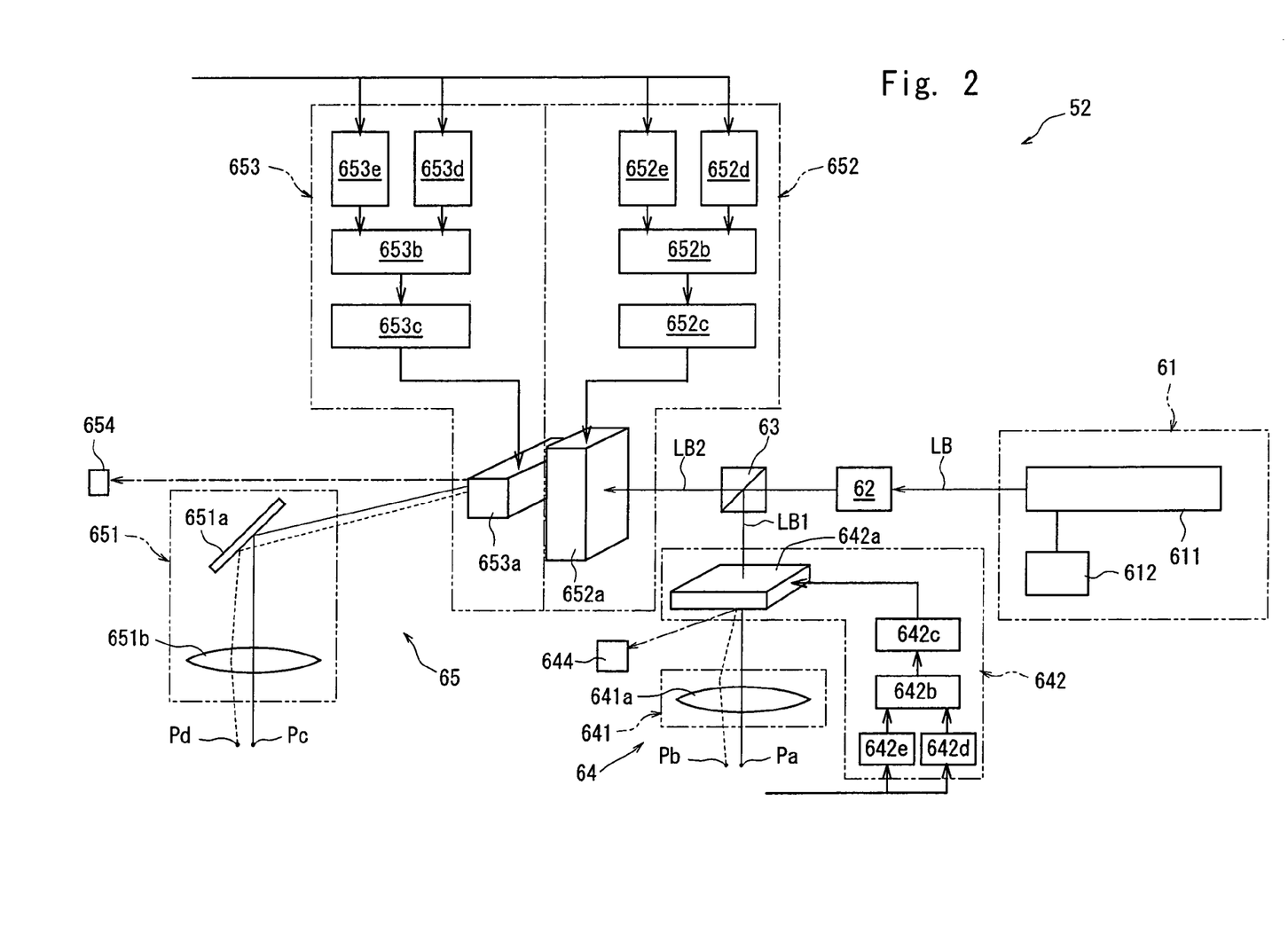
FIG. 2 is a block diagram showing a laser beam application means provided in the laser beam processing machine shown in FIG. 1.

The above laser beam application means 52 comprises a cylindrical casing 521 arranged substantially horizontally. In the casing 521, as shown in FIG. 2, there are installed a pulse laser beam oscillation means 61, an output adjusting means 62, a beam splitter 63 for dividing a pulse laser beam LB oscillated by the pulse laser beam oscillation means 61 into a first pulse laser beam LB1 and a second pulse laser beam LB2, a first laser beam application means 64 for applying the first pulse laser beam LB1 divided by the beam splitter 63 to the workpiece held on the above chuck table 36, and a second laser beam application means 65 for applying the second pulse laser beam LB2 obtained by the above beam splitter 63 to the workpiece held on the above chuck table 36.

The above pulse laser beam oscillation means 61 comprises a pulse laser beam oscillator 611 and a repetition frequency setting means 612 connected to the pulse laser beam oscillator 611. The pulse laser beam oscillator 611 is composed of a YVO4 laser or YAG laser oscillator in the illustrated embodiment and oscillates a pulse laser beam LB of a wavelength (for example, 355 nm) having absorptivity for a workpiece made of silicon. The above output adjusting means 62 adjusts the output of the pulse laser beam LB oscillated from the pulse laser beam oscillation means 61 to a predetermined value. The above beam splitter 63 divides the pulse laser beam LB which has been oscillated from the pulse laser beam oscillation means 61 and has the output adjusted to the predetermined value by the output adjusting means 62, into the first pulse laser beam LB1 and the second pulse laser beam LB2 in a predetermined ratio.

The above first laser beam application means 64 comprises a first condenser 641 for converging the first pulse laser beam LB1 divided by the above beam splitter 63 to apply it to the workpiece held on the above chuck table 36 and an acousto-optic deflection means 642 for deflecting the optical axis of the first pulse laser beam LB1 to the processing-feed direction (X direction). The above first condenser 641 has a condenser lens 641a for converging the first pulse laser beam LB1 passing through the above acousto-optic deflection means 642, and is mounted onto the end of the casing 521.

The above acousto-optic deflection means 642 comprises an acousto-optic device 642a for deflecting the optical axis of the first laser beam LB1 divided by the beam splitter 63 in the processing-feed direction (X direction), an RF oscillator 642b for generating RF (radio frequency) to be applied to the acousto-optic device 642a, an RF amplifier 642c for amplifying the power of RF generated by the RF oscillator 642b to apply it to the acousto-optic device 642a, a deflection angle adjustment means 642d for adjusting the frequency of RF generated by the RF oscillator 642b, and an output adjustment means 642e for adjusting the amplitude of RF generated by the RF oscillator 642b. The above acousto-optic device 642a can adjust the angle deflecting the optical axis of a laser beam according to the frequency of the applied RF and also the output of a laser beam according to the amplitude of the applied RF. The above deflection angle adjustment means 642d and the above output adjustment means 642e are controlled by the control means later described.

The first laser beam application means 64 in the illustrated embodiment has a laser beam absorbing means 644 for absorbing a laser beam deflected by the acousto-optic device 642a as shown by the one-dot chain line in FIG. 2 when RF having a predetermined frequency is applied to the above acousto-optic device 642a.

The first laser beam application means 64 in the illustrated embodiment is constituted as described above. When RF is not applied to the acousto-optic device 642a, the optical axis of the first pulse laser beam LB1 divided by the beam splitter 63 is deflected and focused at a focal point Pa as shown by the solid line in FIG. 2. Meanwhile, when RF having a frequency of, for example, 10 kHz is applied to the acousto-optic device 642a, the optical axis of the first pulse laser beam LB1 divided by the beam splitter 63 is deflected and focused at a focal point Pb which has shifted from the above focal point Pa by a predetermined distance in the processing-feed direction (X direction), as shown by the broken line in FIG. 2. Meanwhile, when RF having a frequency of, for example, 50 kHz is applied to the above acousto-optic device 642a, the optical axis of the first pulse laser beam LB1 divided by the beam splitter 63 is guided to the laser beam absorbing means 644 through the acousto-optic device 642a as shown by the one-dot chain line in FIG. 2.

The above second laser beam application means 65 comprises a second condenser 651 for converging the second pulse laser beam LB2 divided by the above beam splitter 63 to apply it to the workpiece held on the above chuck table 36, a first acousto-optic deflection means 652 for deflecting the optical axis of the second pulse laser beam LB2 in the processing-feed direction (X direction), and a second acousto-optic deflection means 653 for deflecting the optical axis of the second pulse laser beam LB2 in the indexing-feed direction (Y direction). The above second condenser 651 comprises a direction changing mirror 651a for changing the direction of the second pulse laser beam LB2 passing through the above first acousto-optic deflection means 652 and the second acousto-optic deflection means 653 to a downward direction and a condenser lens 651b for converging the second pulse laser beam LB2 whose direction has been changed by the direction changing mirror 651a, and is mounted onto the end of the casing 521.

The above first acousto-optic deflection means 652 comprises a first acousto-optic device 652a for deflecting the optical axis of the second pulse laser beam LB2 divided by the beam splitter 63 in the processing-feed direction (X direction), like the acousto-optic device 642a of the above first laser beam application means 64, a first RF oscillator 652b for generating RF (radio frequency) to be applied to the first acousto-optic device 652a, a first RF amplifier 652c for amplifying the power of RF generated by the first RF oscillator 652b to apply it to the first acousto-optic device 652a, a first deflection angle adjustment means 652d for adjusting the frequency of RF generated by the first RF oscillator 652b, and a first output adjustment means 652e for adjusting the amplitude of RF generated by the first RF oscillator 652b. The above first acousto-optic device 652a can adjust the angle deflecting the optical axis of a laser beam according to the frequency of the applied RF and also the output of a laser beam according to the amplitude of the applied RF. The first deflection angle adjustment means 652d and the first output adjustment means 652e are controlled by the control means later described.

The above second acousto-optic deflection means 653 comprises a second acousto-optic device 653a for deflecting the optical axis of the second pulse laser beam LB2 divided by the beam splitter 63 in the indexing-feed direction perpendicular to the processing-feed direction (X direction), a second RF oscillator 653b for generating RF (radio frequency) to be applied to the second acousto-optic device 653a, a second RF amplifier 653c for amplifying the power of RF generated by the second RF oscillator 653b to apply it to the second acousto-optic device 653a, a second deflection angle adjustment means 653d for adjusting the frequency of RF generated by the second RF oscillator 653b, and a second output adjustment means 653e for adjusting the amplitude of RF generated by the second RF oscillator 653b. The above second acousto-optic device 642a can adjust the angle deflecting the optical axis of a laser beam according to the frequency of the applied RF and also the output of a laser beam according to the amplitude of the applied RF. The above second deflection angle adjustment means 653d and the above second output adjustment means 653e are controlled by the control means later described.

The second laser beam application means 65 in the illustrated embodiment comprises a laser beam absorbing means 654 for absorbing a laser beam not deflected by the first acousto-optic device 652a as shown by the one-dot chain line in FIG. 2 when RF is not applied to the above first acousto-optic device 652a.

The second laser beam application means 65 in the illustrated embodiment is constituted as described above. When RF is not applied to the first acousto-optic device 652a and the second acousto-optic device 653a, the second pulse laser beam LB2 divided by the beam splitter 63 is guided to the laser beam absorbing means 654 through the first acousto-optic device 652a and the second acousto-optic device 653a, as shown by the one-dot chain line in FIG. 2. Meanwhile, when RF having a frequency of, for example, 10 kHz is applied to the first acousto-optic device 652a, the optical axis of the second pulse laser beam LB2 divided by the beam splitter 63 is deflected and focused at a focal point Pc as shown by the solid line in FIG. 2. When RF having a frequency of, for example, 20 kHz is applied to the first acousto-optic device 652a, the optical axis of the second pulse laser beam LB2 divided by the beam splitter 63 is deflected as shown by the broken line in FIG. 2 and focused at a focal point Pd which has shifted from the above focal point Pc by a predetermined distance in the processing-feed direction (X direction). When RF having a predetermined frequency is applied to the second acousto-optic device 653a, the optical axis of the second pulse laser beam LB2 divided by the beam splitter 63 is focused at a focal point which has shifted from the above focal point Pc by a predetermined distance in the indexing-feed direction (Y direction: perpendicular to the sheet in FIG. 2) perpendicular to the processing-feed direction (X direction).

Figure 3:
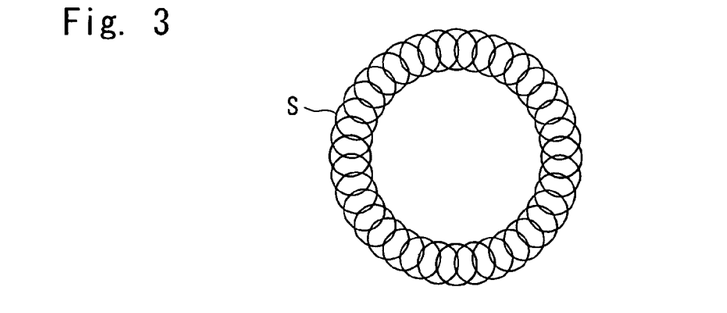
FIG. 3 is an explanatory diagram showing trepanning processing which is carried out by the second laser beam application means of the laser beam application means shown in FIG. 2.

Therefore, trepanning processing for moving the spot S of the pulse laser beam in a loop as shown in FIG. 3 can be carried out by activating the first acousto-optic deflection means 652 and the second acousto-optic deflection means 653 to deflect the optical axis of the pulse laser beam in the X direction and Y direction sequentially.

Returning to FIG. 1, an image pick-up means 7 for detecting the area to be processed by the laser beam application means 52 is mounted onto the end portion of the casing 521 constituting the above laser beam application means 52. This image pick-up means 7 comprises an infrared illuminating means for applying infrared radiation to the workpiece, an optical system for capturing infrared radiation applied by the infrared illuminating means, and an image pick-up device (infrared CCD) for outputting an electric signal corresponding to infrared radiation captured by the optical system, in addition to an ordinary image pick-up device (CCD) for picking up an image with visible radiation. An image signal is supplied to the control means later described.

The laser beam application unit 5 in the illustrated embodiment has a focal point positioning means 53 for moving the unit holder 51 along the pair of guide rails 423 and 423 in the direction indicated by the arrow Z (direction perpendicular to the holding surface which is the top surface of the adsorption chuck 361). The focal point positioning means 53 comprises a male screw rod (not shown) arranged between the pair of guide rails 423 and 423 and a drive source such as a pulse motor 532 for rotary-driving the male screw rod. By driving the male screw rod (not shown) in a normal direction or reverse direction with the pulse motor 532, the unit holder 51 and the laser beam application means 52 comprising the first condenser 641 and the second condenser 651 are moved along the guide rails 423 and 423 in the direction indicated by the arrow Z. In the illustrated embodiment, the laser beam application means 52 is moved up by driving the pulse motor 532 in a normal direction and moved down by driving the pulse motor 532 in the reverse direction.

The laser beam processing machine 1 in the illustrated embodiment comprises the control means 10. The control means 10 is composed of a computer comprising a central processing unit (CPU) 101 for carrying out arithmetic processing based on a control program, a read-only memory (ROM) 102 for storing the control program, etc., a read/write random access memory (RAM) 103 for storing the results of operations, a counter 104, an input interface 105 and an output interface 106. Detection signals from the above processing-feed amount detection means 374, the indexing-feed amount detection means 384 and the image pick-up means 7 are input to the input interface 105 of the control means 10. Control signals are output to the above pulse motor 372, the pulse motor 382, the pulse motor 432, the pulse motor 532, the pulse laser beam oscillation means 61 and the output adjusting means 62 of the pulse laser beam oscillation means 52, the deflection angle adjustment means 642d and the output adjustment means 642e constituting the acousto-optic deflection means 642 of the first laser application means 64, the first deflection angle adjustment means 652d and the first output adjustment means 652e of the first acousto-optic deflection means 652 and the second deflection angle adjustment means 653d and the second output adjustment means 653e of the second acousto-optic deflection means 653 constituting the second laser beam application means 65.

The illustrated laser beam processing machine 1 is constituted as described above, and the via hole forming method which is carried out by using the laser beam processing machine 1 will be described hereinbelow.

Figure 4:
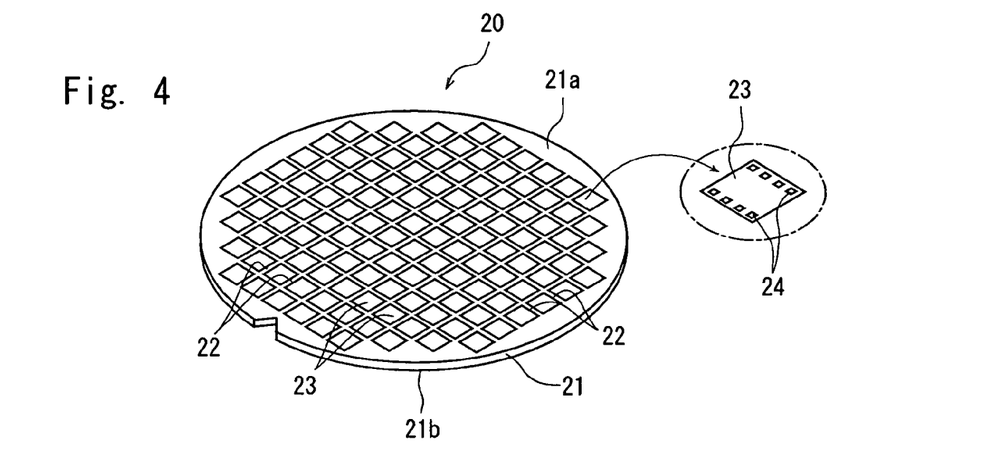
FIG. 4 is a perspective view of a semiconductor wafer as a plate-like workpiece.
Figure 5:
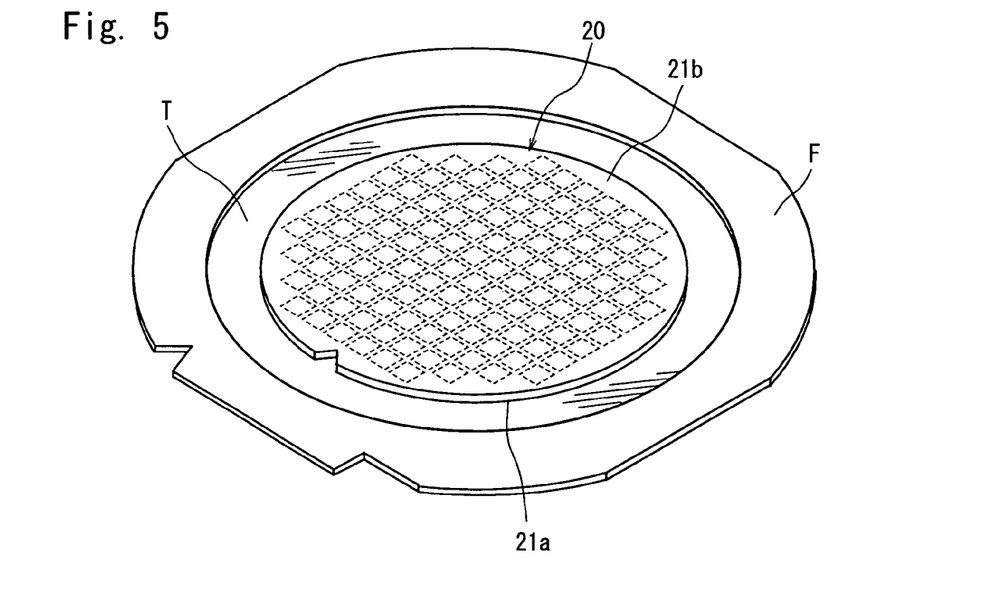
FIG. 5 is a perspective view of the semiconductor wafer shown in FIG. 4 put on the surface of a protective tape mounted on an annular frame.

FIG. 4 is a perspective view of a semiconductor wafer 20 as the wafer. In the semiconductor wafer 20 shown in FIG. 4, a plurality of areas are sectioned by a plurality of streets 22 arranged in a lattice pattern on the front surface 21a of a substrate 21 made of silicon and having a thickness of, for example, 100 μm, and a device 23 such as IC or LSI is formed in each of the sectioned areas. The devices 23 are the same in constitution. A plurality of bonding pads 24 are formed on the surface of each device 23. The bonding pads 24 are made of a metal material such as aluminum, copper, gold, platinum or nickel and have a thickness of, for example, 1 to 5 μm. The front surface 21a of the semiconductor wafer 20 formed as described above is put on a protective tape T composed of a synthetic resin sheet such as a polyolefin sheet mounted on an annular frame F as shown in FIG. 5. Therefore, the rear surface 21b of the semiconductor wafer 20 faces up.

The protective tape T side of the semiconductor wafer 20 supported to the annular frame F through the protective tape T as shown in FIG. 5 is placed on the chuck table 36 of the laser beam processing machine 1 shown in FIG. 1. The semiconductor wafer 20 is suction-held on the chuck table 36 through the protective tape T by activating the suction means that is not shown. The annular frame F is fixed by the clamps 362.

The chuck table 36 suction-holding the semiconductor wafer 20 as described above is brought to a position right below the image pick-up means 7 by the processing-feed means 37. After the chuck table 36 is positioned right below the image pick-up means 7, alignment work for detecting the area to be processed of the semiconductor wafer 20 is carried out by the image pick-up means 7 and the control means 10. That is, the image pick-up means 7 and the control means 10 carry out image processing such as pattern matching, etc. to align a street 22 formed in a predetermined direction of the semiconductor wafer 20 with the first condenser 641 and the second condenser 651 of the laser beam application means 52 for applying a laser beam along the street 22, thereby performing the alignment of a laser beam application position. The alignment of the laser beam application position is also carried out on streets 22 formed on the semiconductor wafer 20 in a direction perpendicular to the above predetermined direction. Although the front surface 21a having the streets 22 of the semiconductor wafer 20 faces down at this point, as the image pick-up means 7 comprises the infrared illuminating means, an optical system for capturing infrared radiation and an image pick-up device (infrared CCD) for outputting an electric signal corresponding to the infrared radiation as described above, an image of the street 22 can be picked up through the rear surface 21b.

Figure 6:
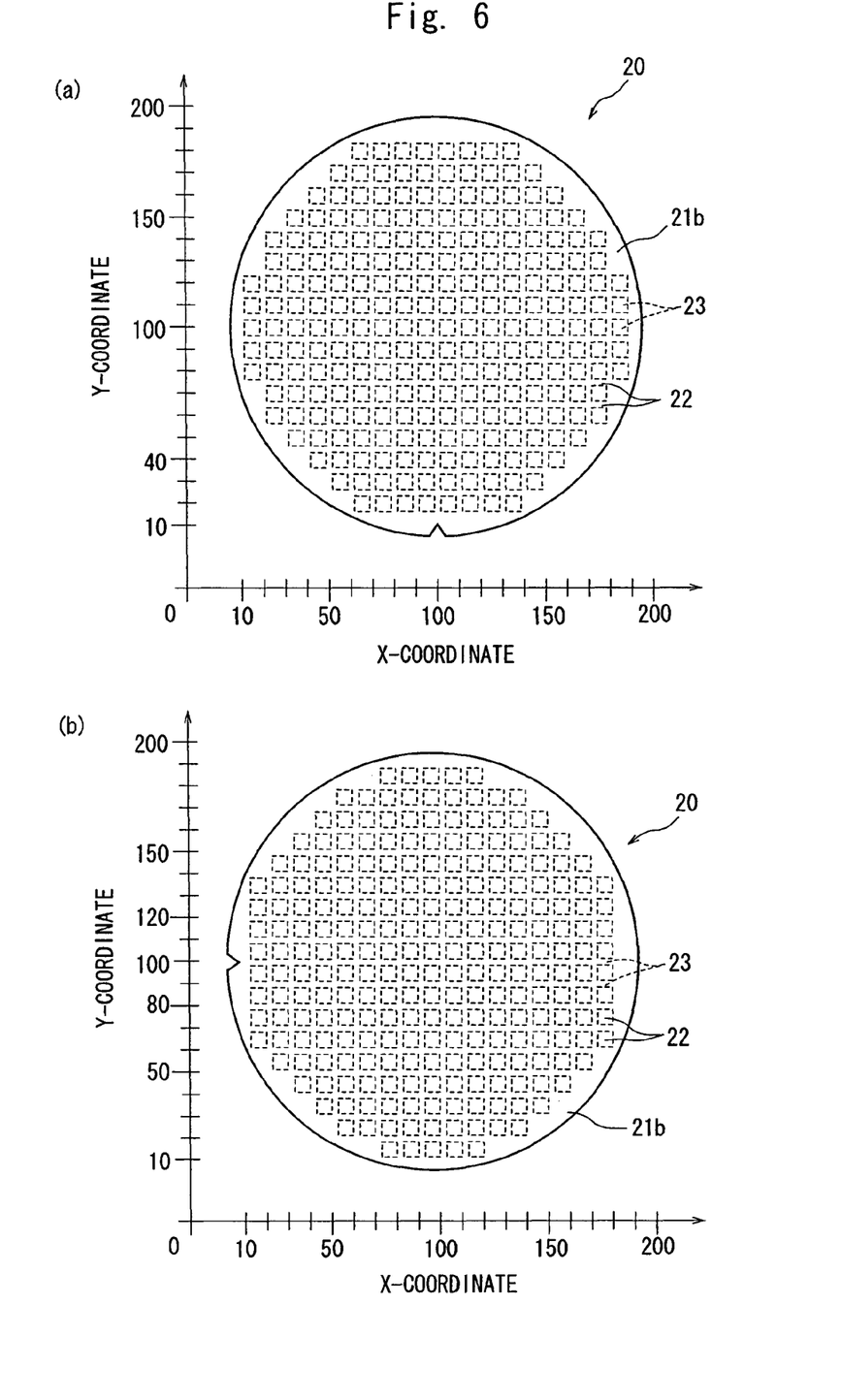
FIGS. 6(a) and 6(b) are explanatory diagrams showing the relationship between the semiconductor wafer shown in FIG. 4 and a coordinate position in a state where the semiconductor wafer is held at a predetermined position of the chuck table of the laser beam processing machine shown in FIG. 1.

After the above alignment is carried out, the semiconductor wafer 20 suction-held on the chuck table 36 is supposed to be located at a predetermined coordinate position. FIG. 6(b) shows that the chuck table 36, that is, the semiconductor wafer 20 is turned at 90° from the state shown in FIG. 6(a). The design values of the coordinates of the bonding pads 24 formed on each of the devices 23 formed on the front surface 21a of the substrate 21 of the semiconductor wafer 20 are stored in the random access memory (RAM) 103 of the above control means 10.

The chuck table 36 suction-holding the semiconductor wafer 20 as described above is positioned right below the image pick-up means 7 by the processing-feed means 37. Thereafter, alignment work for checking whether the streets 22 formed in a lattice pattern on the semiconductor wafer 20 held on the chuck table 36 are parallel to the X direction and the Y direction is carried out. That is, the image pick-up means 33 picks up an image of the semiconductor wafer 20 held on the chuck table 36 and carries out image processing such as pattern matching, etc. to perform the alignment work. Although the street 22 formed front surface 21a of the substrate 21 of the semiconductor wafer 20 faces down at this point, an image of the streets 22 can be picked up through the rear surface 21b of the substrate 21 as the image pick-up means 7 comprises an infrared illuminating means, an optical system for capturing infrared radiation and an image pick-up device (infrared CCD) for outputting an electric signal corresponding to the infrared radiation as described above.

Figure 7:
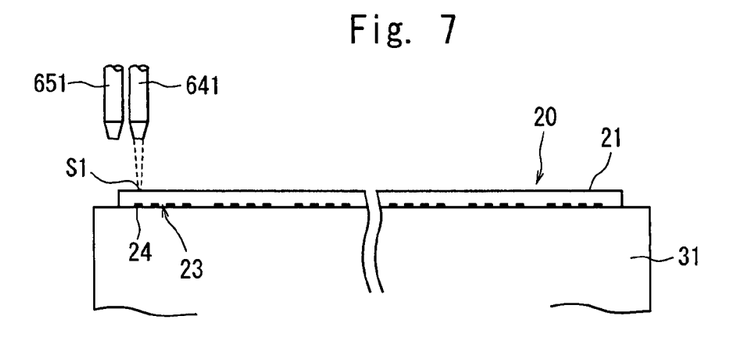
FIG. 7 is an explanatory diagram showing the via hole forming step which is carried out by using the laser beam processing machine shown in FIG. 1.

After the above alignment work is carried out, the chuck table 36 is moved as shown in FIG. 7 to bring a device 23 at the most left end in FIG. 7 out of the plurality of devices 23 formed in a predetermined direction on the substrate 21 of the semiconductor wafer 20 to a position right below the first condenser 641 and the second condenser 651. Then, a bonding pad 24 at the most left end out of the plurality of bonding pads 24 formed on the device 23 at the most left end in FIG. 7 is brought to a position right below the first condenser 641.

Next comes the step of forming a via hole reaching the bonding pad 24 from the rear surface 21b of the substrate 21 by applying the first pulse laser beam LB1 from the rear surface 21b side of the substrate 21 from the first condenser 641 of the first laser beam application means 64. To carry out this via hole forming step, RF is not applied to the first acousto-optic device 652a and the second acousto-optic device 653a of the second laser beam application means 65, and the second pulse laser beam LB2 divided by the beam splitter 63 is guided to the laser beam absorbing means 654 through the first acousto-optic device 652a and the second acousto-optic device 653a as shown by the one-dot chain line in FIG. 2. Meanwhile, the first laser beam application means 64 applies RF having a frequency of, for example, 10 kHz to the acousto-optic device 642a and focuses the optical axis of the first pulse laser beam LB1 divided by the beam splitter 63 at the focal point Pa as shown by the solid line in FIG. 2.

Then, the control means 10 controls the output adjusting means 62 to adjust the energy density per one pulse of the first pulse laser beam LB1 applied from the first condenser 641 to 20 to 60 J/cm$^2$ after the beam splitter 63 divides the laser beam in the predetermined ratio. To further control the energy density per one pulse of the first pulse laser beam LB1, the output adjustment means 642e of the acousto-optic deflection means 642 may be used. The spot diameter of the first pulse laser beam LB1 converged by the first condenser 641 is set to 0.75 to 0.9 D when the spot diameter of the via hole to be formed is represented by D.

Figure 8:
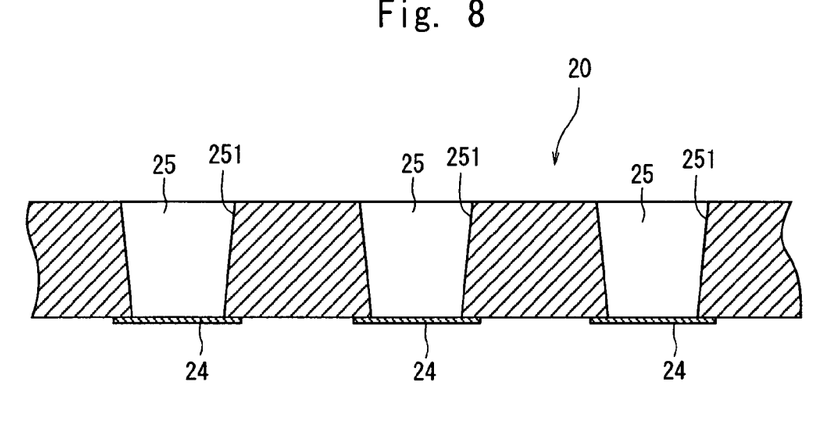
FIG. 8 is a partially enlarged sectional view of the semiconductor wafer having via holes which have been formed by the via hole forming step shown in FIG. 7.

After the above processing conditions are set as described above, the control means 10 activates the laser beam application means 52 to apply the first pulse laser beam LB1 from the first condenser 641 of the first laser beam application means 64 from the rear surface 21b side of the substrate 21. For example, when the energy density is set to 40 J/cm$^2$ and the substrate 21 of the semiconductor wafer 20 is made of silicon, as shown in FIG. 7, a hole having a depth of 2 μm can be formed with one pulse of the pulse laser beam by setting a spot S1 having the above spot diameter to the rear surface 21b (top surface) of the substrate 21. Therefore, when the thickness of the substrate 21 made of silicon is 100 μm, a via hole 25 extending from the rear surface 21b to the front surface 21a of the substrate 21, that is, reaching the bonding pad 24 can be formed by applying 50 pulses of the pulse laser beam, as shown in FIG. 8. The inner peripheral wall of the via hole 25 formed as described above is formed into a tapered surface 251 tapering toward the front surface 21a from the rear surface 21b of the substrate 21. When the thickness of the substrate 21 made of silicon is 100 μm and the diameter on the rear surface 21b side of the tapered surface 251 of the via hole 25 is 100 μm, the diameter of the via hole 25 on the front surface 21a side thereof is about 60 μm.

When the above via hole forming step is carried out, as the pulse laser beam used to form the via hole is slightly applied to the rear surface of the bonding pad 24, metal atoms of the metal forming the bonding pad 24 are slightly scattered to become metal contaminants which may adhere to the tapered surface 251 which is the inner wall of the via hole 25 by electrostatic force. The metal contaminants adhering to the tapered surface 251 of the via hole 25 are desirably removed because they diffuse into the inside of the substrate 21 to reduce the quality of each device 23.

Therefore, a cleaning step for removing the metal contaminants adhering to the tapered surface 251 of the via hole 25 by applying a pulse laser beam to the tapered surface 251 which is the inner wall of the via hole 25 formed in the substrate 21 is carried out. In this cleaning step, trepanning processing for applying the second pulse laser beam LB2 divided by the beam splitter 63 of the laser beam application means 52 constituting the above laser beam processing machine 1 is carried out.

When trepanning processing is carried out by using the second pulse laser beam LB2 divided by the beam splitter 63 of the laser beam application means 52, the first acousto-optic device 652a and the second acousto-optic device 653a of the second laser beam application means 65 are activated to deflect the optical axis of the second pulse laser beam LB2 divided by the beam splitter 63 of the laser beam application means 52 in the X direction and the Y direction sequentially to carry out trepanning processing for moving the spot S of the pulse laser beam in a loop as shown in FIG. 3.

The control means 10 controls the output adjusting means 62 to adjust the energy density per one pulse of the second pulse laser beam LB2 applied from the second condenser 651 to 3 to 20 J/cm$^2$ after the beam splitter 63 divides the laser beam in the predetermined ratio. To further control the energy density per one pulse of the second pulse laser beam LB2, the first output adjustment means 652e of the first acousto-optic deflection means 652 and the second output adjustment means 653e of the second acousto-optic deflection means 653 may be used. The spot diameter of the second pulse laser beam LB2 converged by the second condenser 651 for converging the second pulse laser beam LB2 is set to 0.2 to 0.3 D when the diameter of the via hole to be formed is represented by D.

Figure 9:
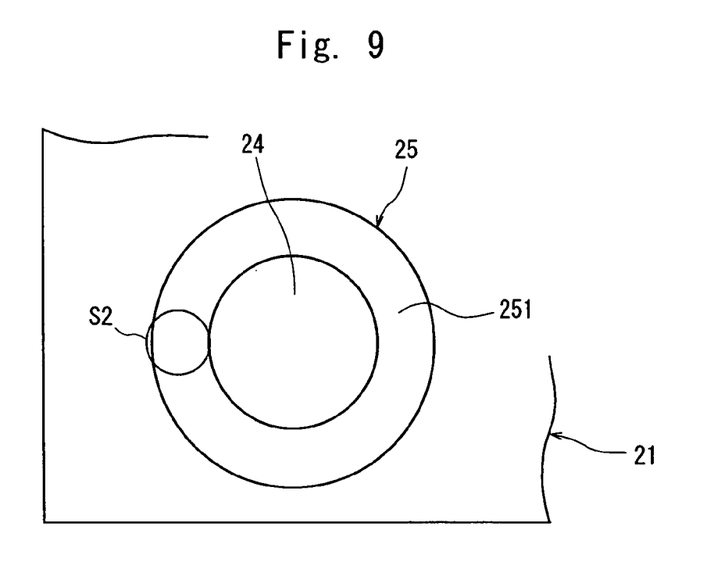
FIG. 9 is an explanatory diagram showing the cleaning step which is carried out by using the laser beam processing machine shown in FIG. 1.

To carry out the cleaning step under the above processing conditions, as shown in FIG. 9, the spot S2 of the second pulse laser beam LB2 applied from the second condenser 651 of the above laser beam application means 52 is so adjusted as to be positioned at the tapered surface 251 which is the inner peripheral wall of the via hole 25 formed in the substrate 21. The laser beam application means 52 and the chuck table 36 are activated to carry out trepanning processing as shown in FIG. 3. It is important that the center (the position of the peak of a Gaussian distribution) of the spot S2 of the pulse laser beam should not be applied to the bonding pad 24 at this point. As a result, the pulse laser beam is applied along the tapered surface 251 which is the inner peripheral wall of the via hole 25 formed in the substrate 21 to remove the metal contaminants adhering to the tapered surface 251 by electrostatic force. Since the energy density of the pulse laser beam applied in this cleaning step is low, the substrate 21 is not processed.

In the laser beam processing machine in the illustrated embodiment, a via hole having a different diameter can be formed by carrying out trepanning processing with the second pulse laser beam LB2 from the second laser beam application means 65.

What is claimed is:

1. A laser beam processing machine for forming via holes in a silicon workpiece having bonding pads on a front surface thereof, said processing machine comprising:
   a chuck table for holding the workpiece,
   a laser beam application means for applying a laser beam to the workpiece held on the chuck table, the laser beam application means including a pulse laser beam oscillation means for oscillating a pulse laser beam, a beam splitter for dividing the pulse laser beam into a first pulse laser beam and a second pulse laser beam, a first application means for applying the first pulse laser beam, and a second application means for applying the second pulse laser beam, the second application means having a first acousto-optic deflection means, and a second acousto-optic deflection means,
   a processing-feed means for moving the chuck table and the laser beam application means relative to each other in a processing-feed direction,
   an indexing-feed means for moving the chuck table and the laser beam application means in an indexing-feed direction perpendicular to the processing-feed direction, and
   a control means for controlling operation of the laser beam application means, the processing feed means, and the indexing-feed means,
   wherein the control means causes the first application means to apply the first pulse laser beam at an energy density per pulse of 20 to 60 J/cm$^2$ in order to form a via hole having tapered walls through a rear surface of the silicon workpiece to one of the bonding pads, and thereafter causes the second application means to apply the second pulse laser beam at an energy density per pulse of 3 to 20 J/cm$^2$ onto the tapered walls of the formed via hole while causing the first acousto-optic deflection means to deflect the optical axis of the second pulse laser beam in the processing-feed direction and the second acoustic-optical deflection means to deflect the optical axis of the second pulse laser beam in the indexing-feed direction so as to trepan the formed via hole.

2. The laser beam processing machine according to claim 1, wherein the first application means sets the spot diameter of the first pulse laser beam to 0.75 to 0.9 D and the second application means sets the spot diameter of the second pulse laser beam to 0.2 to 0.3 D when the diameter of the via hole to be formed is represented by D.

3. The laser beam processing machine according to claim 1, wherein the first application means comprises an acousto-optic deflection means for deflecting the optical axis of a first pulse laser beam in the processing-feed direction.

* * * * *